United States Patent [19]

Gumm

[11] Patent Number: 4,728,884
[45] Date of Patent: Mar. 1, 1988

[54] INFINITE DYNAMIC RANGE PHASE DETECTOR

[75] Inventor: Linley F. Gumm, Beaverton, Oreg.

[73] Assignee: Tektronix, Inc., Beaverton, Oreg.

[21] Appl. No.: 917,454

[22] Filed: Oct. 9, 1986

[51] Int. Cl.[4] ............................................. G01R 25/00
[52] U.S. Cl. ................................. 324/83 D; 324/79 R; 328/133; 331/25
[58] Field of Search ............ 455/208; 324/77 R, 77 A, 324/83 R, 83 A, 83 D, 79 R, 79 D, 77 B, 77 D, 77 E; 331/25; 328/133

[56] References Cited

U.S. PATENT DOCUMENTS

| | | | |
|---|---|---|---|
| 3,978,403 | 8/1976 | Mansfield | 324/79 R |
| 4,053,834 | 10/1977 | Lerner | 455/208 |
| 4,627,079 | 12/1986 | Van der Embse | 324/77 E |

Primary Examiner—Michael J. Tokar
Attorney, Agent, or Firm—Francis I. Gray

[57] ABSTRACT

An infinite dynamic range phase detector compares a test signal with a phase shifted reference signal which tracks the phase drift of the test signal. The incremental phase error between the test signal and the phase shifted reference signal is accumulated to provide an n*modulo(360) plus the increment between zero and 360 degrees output. A portion of the accumulated output is fed back as an offset which is applied to a reference signal to produce the phase shifted reference signal.

7 Claims, 2 Drawing Figures

INFINITE DYNAMIC RANGE PHASE DETECTOR

BACKGROUND OF THE INVENTION

The present invention relates to phase detectors, and more particularly to an infinite dynamic range phase detector which extends the dynamic range of a phase detector to any desired limit.

For characterizing the behavior of networks that will be stimulated by arbitrary signals and interfaced with a variety of other networks, network analyzers were developed to provide a complete description of a given network's behavior in the frequency domain. The parameters of the given network not only vary as a function of frequency, but are also complex variables in that they have both magnitude and phase. Network analyzers measure magnitude and phase as a function of frequency, from which impedance and transfer functions can be displayed. The measurements are accomplished through sine wave testing, i.e., a test sine wave signal is applied to the network under test and the fundamental of the output sine wave signal from the network is compared to a reference sine wave signal which is generally the test sine wave signal. In many network analyzers, such as the Model 8410 Series Network Analyzers manufactured by Hewlett-Packard Company of Palo Alto, Calif., for measuring phase a phase detector compares the reference signal with the output signal from the network being tested. If the phase of the output signal shifts further than ±180°, the phase detector output resets by flipping from one extreme, +180°, to the other, −180°. For short duration measurements this dynamic range is generally adequate. But for measurements over extended frequency ranges what is desired is the total phase shift, not just the relative phase shift within a ±180° range.

Also it is desired to know whether the phase shift is positive or negative. If the indication of phase shift is −10°, it is ambiguous as to whether the shift was actually +350°.

SUMMARY OF THE INVENTION

Accordingly the present invention provides an infinite dynamic range phase detector which uses a feedback system and phase tracking to extend the dynamic range to any desired limit. A reference signal is input to a phase shift circuit, and the shifted reference signal is input to a phase detector together with a test signal. The output of the phase detector is an error signal which is input to a control circuit where the error signal is accumulated. The control circuit outputs a phase value corresponding to n*modulo(360) plus the increment over 360°. The control circuit also outputs an offset signal which is input to the phase shifter to determine the amount of the reference signal shift to track the test signal.

The objects, advantages and other novel features of the present invention will be apparent from the following detailed description when read in conjunction with the appended claims and attached drawing.

DESCRIPTION OF THE PREFERRED EMBODIMENT

Figure 1:
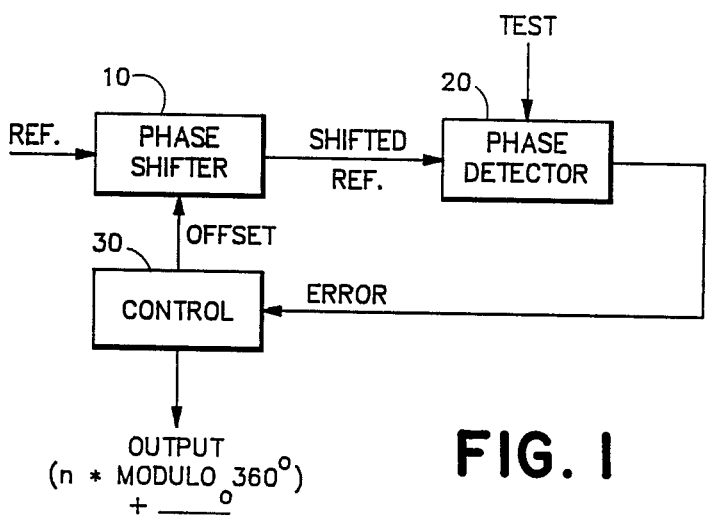
FIG. 1 is a basic block diagram view of an infinite dynamic range phase detector according to the present invention.

The basic concept of an infinite dynamic range phase detector is illustrated by FIG. 1. A reference signal is input to a phase shifter 10 to produce a shifted reference signal. The shifted reference signal is compared with a test, or unknown, signal in a phase detector 20. The resulting error signal from the phase detector 20 is input to a control circuit 30 where the error signal is added, or subtracted depending upon the sign of the error, to an accumulated value. The output of the control circuit 30 is the total phase shift of the test signal with respect to the reference signal over the period of measurement, with the most significant portion of the output indicating the number of complete phase revolutions completed (n*modulo(360)) and the least significant portion representing the portion of a phase revolution completed. The control circuit 30 also provides an offset signal which is input to the phase shifter 10 to update the phase shift value for the reference signal such that the shifted reference signal tracks the test signal. Thus, the error signal is always the incremental error of the test signal with respect to the reference signal between samples output from the phase detector 20.

Figure 2:
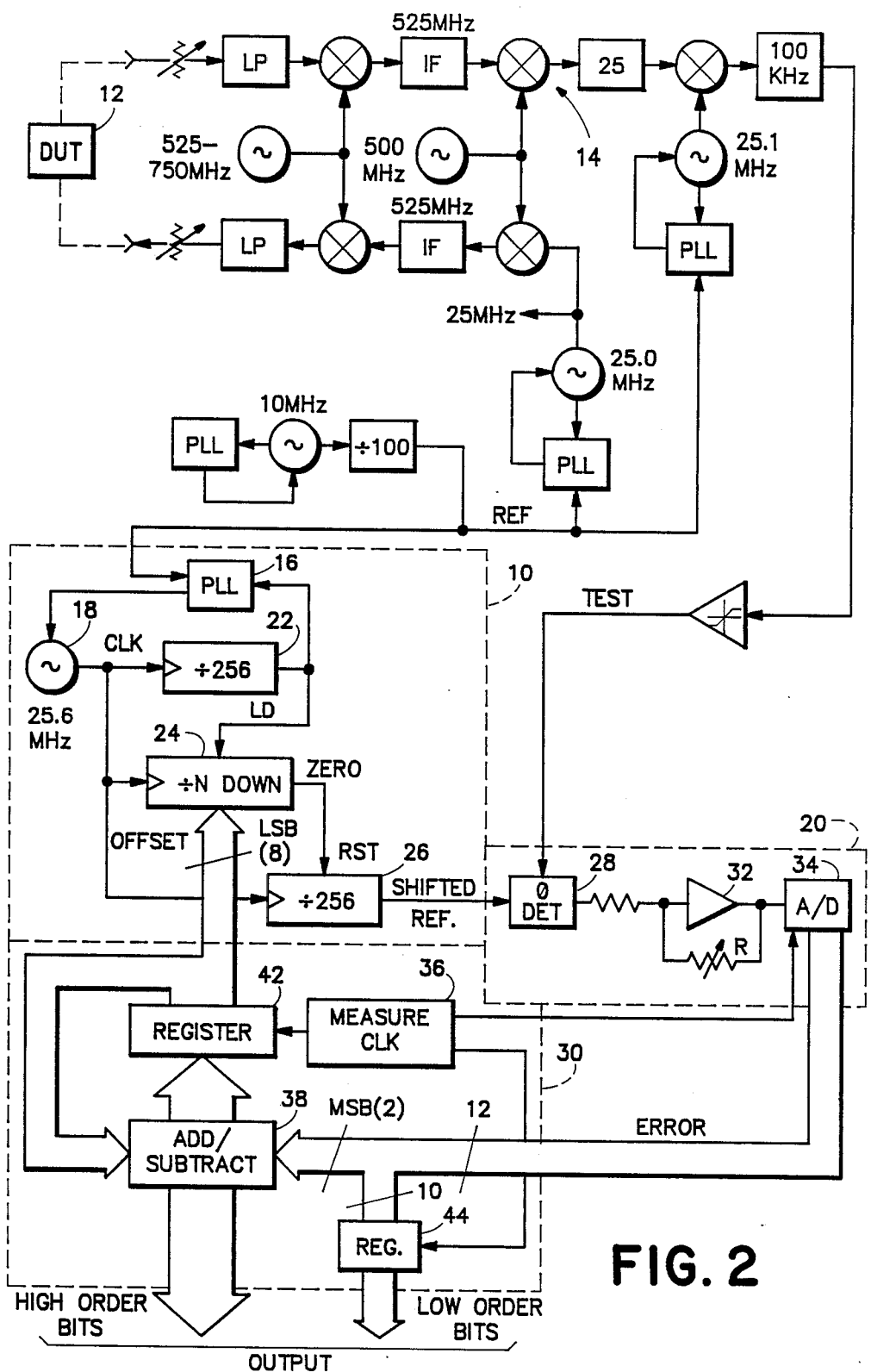
FIG. 2 is a block diagram view of a specific embodiment of the infinite dynamic range phase detector of FIG. 1.

Referring now to FIG. 2 one specific embodiment in the digital environment is described to further illustrate the concept of the present invention. A device under test (DUT) 12 is connected to a tracking generator 14 which generates a test signal to be applied to the DUT, and then receives the test signal as an output signal from the DUT. A reference signal REF is used to generate the test signal. For this illustration the reference signal is a 100 kHz square wave. The output of the tracking generator 14 is the test signal TEST from the DUT 12, the phase shift of which is to be measured as the frequency to the DUT is varied. The DUT 12 may be any network including a bridge used to detect return loss. The reference signal is input to a phase locked loop (PLL) 16 within the phase shifter 10. The PLL 16 controls a system clock 18 having a frequency which is an integer multiple of the reference signal frequency. For this embodiment the system clock frequency is 25.6 MHz. The output CLK of the system clock 18 is input to a divider 22 to produce a signal having the same frequency as the reference signal for input to the PLL 16.

The output of the divider 22 provides a load signal LD to a divide-by-N countdown register 24 which is clocked by the CLK signal from the system clock 18. When the countdown register 24 is clocked down to zero, an output signal resets a phase divider 26 which is also clocked by the CLK signal from the system clock 18. The output of the phase divider 26 is the shifted reference signal which is input to the phase detector 20. The TEST signal and the shifted reference signal are input to a phase detector circuit 28 which outputs an analog voltage representative of the difference in phase between the two input signals. The analog voltage is scaled by an amplifier 32 and digitized by an analog to digital converter (A/D) 34. A measurement clock 36 provides the timing for the A/D 34 to digitize the analog voltage at discrete intervals. The most significant bits of the digitized error signal are input to an adder/subtracter 38 and are summed with the contents of an accumulation register 42 depending upon the sign bit which indicates whether the TEST signal is leading or lagging the reference signal. The least significant bits of the digitized error signal are output via an output register 44 when clocked by the output of the measurement clock 36.

The output of the measurement clock 36 also is applied to the register 42 to transfer the results from the adder/subtracter 38 to the register and to the output. The least significant bits from the register 42 are loaded into the countdown register 24 when the LD signal is received from the divider 22. This causes the countdown register 24 to bring the phase of the shifted reference signal more closely equal to the phase of the test signal. In operation the contents of the register 42 vary as the phase of the test signal is tracked. If more than 360° of phase change is accumulated, the low order bits of the register 42 go from a high value to zero as the high order bits are incremented by one. As a result the phase of the countdown register 24 moves precisely ahead 360°. The net effect is that the register 42 accumulates the high order part of the phase change.

For slowly varying phase shifts this circuit provides precise results. However for rapidly varying phase shifts the tracking is limited by the dynamic swing in terms of degrees/volt applied to the A/D converter 34. With a twelve bit output from the A/D converter 34 there are 4096 output states which correspond to some input voltage range, such as ±10 volts. For the values shown the gain of the scaling amplifier 32 is such that the entire range of the A/D converter is four "gumms", where one gumm is 1/256 of a cycle or 360/256 degrees, a total of 5.625 degrees. If the phase of the test signal relative to the reference signal is changing faster than four gumms/measurement, the A/D converter 34 will be out of range, producing erroneous results. By varying the number of bits fed back to the adder/subtracter 38, and hence to the register 42, and decreasing the gain of the scaling amplifier 32 simultaneously, the dynamic range of the A/D converter 34 may be extended. This can be done by replacing the variable feedback resistor R with a multiplying digital to analog converter (DAC) so that the gain may be readily changed by a factor of two by shifting a gain value by one bit. The loop gain is held constant by also shifting the data field of the A/D converter 34 input to the adder/subtracter 38 one bit per factor of two of gain change. The result is the ability to follow rapid changes in phase with a concomitant loss in precision, while still maintaining high precision for slowly varying phase changes.

Alternatively the test signal may be converted to a digital signal prior to being input to the phase detector 20, and the phase difference determined digitally. The dynamic range of the present invention is a function of the number of bits of the register 42. For example for a sixteen bit register 42 the range is up to 256*modulo(360). Therefore, theoretically the dynamic range can be extended infinitely. The output is the combination of the output from the adder/subtractor 38 which has a resolution of one gumm and the least significant bits from the A/D converter 34 which provides resolution greater than one gumm, corresponding to a fractional part of one gumm. The most significant bits from the A/D converter 34 represent the phase shift corresponding to integer multiples of one gumm.

Although the above embodiment has been described in a digital environment, the invention may also be implemented in the analog environment by using an analog phase shifter and analog integrators.

Thus the present invention provides an infinite dynamic range phase detector by using a feedback of a portion of the phase error signal to be added to an accumulated value, the output being a function of n*modulo(360) where n is a function of the bit size of the accumulation register, and by comparing the test signal with a phase shifted reference signal which tracks the test signal so that the error signal represents an incremental phase drift between sample intervals.

What is claimed is:

1. An infinite dynamic range phase detector comprising:
   means for phase shifting a reference signal to produce a shifted reference signal;
   means for determining the phase difference between the shifted reference signal and a test signal to produce an error signal; and
   means for computing from the error signal an accumulated output signal, a portion of the accumulated output signal being used to provide an offset to the phase shifting means such that the shifted reference signal tracks the test signal in phase.

2. An infinite dynamic range phase detector as recited in claim 1 wherein the phase shifting means comprises:
   a clock phase loop locked to the reference signal, the clock having a frequency which is an integer multiple of the frequency of the reference signal;
   a countdown register having as one input the offset, the offset being loaded into the countdown register at the reference signal rate and being counted down at the clock rate, and having a zero output when the offset is counted down to zero; and
   a shifter divider having as an input the clock output and having as an output the shifted reference clock, the shifter divider being reset by the zero output from the countdown register.

3. An infinite dynamic range phase detector as recited in claim 1 wherein the determining means comprises:
   a phase comparator having as inputs the shifted reference signal and the test signal, and having as an output an analog voltage representative of the error signal; and
   means for converting the analog voltage into a digital error signal for input to the computing means.

4. An infinite dynamic range phase detector as recited in claim 3 wherein the determining means further comprises means for scaling the analog voltage prior to input to the converting means to enable the infinite dynamic range phase detector to track rapid changes in the phase difference between the reference signal and the test signal.

5. An infinite dynamic range phase detector as recited in claim 1 wherein the determining means comprises:
   means for converting the test signal into a digital test signal; and
   a digital phase comparator having as inputs the shifted reference signal and the digital test signal, and having as an output a digital error signal for input to the computing means.

6. An infinite dynamic range phase detector as recited in claim 5 wherein the determining means further comprises means for scaling the digital error signal to enable the infinite dynamic range phase detector to track rapid changes in the phase difference between the reference signal and the test signal.

7. An infinite dynamic range phase detector as recited in claim 1 wherein the computing means comprises:
   means for storing an accumulated value corresponding to the accumulated output signal, the least significant portion of the accumulated value being the offset; and
   means for summing the most significant portion of the error signal with the accumulated value to update the accumulated value contained in the storing means, the remaining least significant portion of the error signal being the least significant portion of the accumulation output signal.

* * * * *